United States Patent
Cernea (10) Patent No.: US 9,123,430 B2
(45) Date of Patent: Sep. 1, 2015

(54) DIFFERENTIAL CURRENT SENSE AMPLIFIER AND METHOD FOR NON-VOLATILE MEMORY

(71) Applicant: SanDisk 3D LLC, Milpitas, CA (US)

(72) Inventor: Raul Adrian Cernea, Santa Clara, CA (US)

(73) Assignee: SANDISK 3D LLC, Milpitas, CA (US)

( * ) Notice: Subject to any disclaimer, the term of this patent is extended or adjusted under 35 U.S.C. 154(b) by 221 days.

(21) Appl. No.: 13/918,833

(22) Filed: Jun. 14, 2013

(65) Prior Publication Data

US 2014/0369132 A1    Dec. 18, 2014

(51) Int. Cl.
G11C 16/06    (2006.01)
G11C 16/28    (2006.01)
G11C 7/06    (2006.01)

(52) U.S. Cl.
CPC ............... *G11C 16/28* (2013.01); *G11C 7/062* (2013.01); *G11C 2207/063* (2013.01)

(58) Field of Classification Search
CPC ... G11C 16/28; G11C 7/062; G11C 2207/063
USPC ........................... 365/185.09, 185.21, 185.22
See application file for complete search history.

(56) References Cited

U.S. PATENT DOCUMENTS

| | | | |
|---|---|---|---|
| 5,570,315 A | 10/1996 | Tanaka et al. | |
| 5,774,397 A | 6/1998 | Endoh et al. | |
| 6,046,935 A | 4/2000 | Takeuchi et al. | |
| 6,373,746 B1 | 4/2002 | Takeuchi et al. | |
| 6,456,528 B1 | 9/2002 | Chen | |
| 6,522,580 B2 | 2/2003 | Chen et al. | |
| 6,643,188 B2 | 11/2003 | Tanaka et al. | |
| 6,771,536 B2 | 8/2004 | Li et al. | |
| 6,781,877 B2 | 8/2004 | Cernea et al. | |
| 7,016,226 B2 * | 3/2006 | Shibata et al. | 365/185.03 |
| 7,016,230 B2 * | 3/2006 | Hosono | 365/185.17 |
| 7,023,739 B2 | 4/2006 | Chen et al. | |
| 7,064,568 B2 | 6/2006 | Hunt et al. | |
| 7,177,191 B2 | 2/2007 | Fasoli et al. | |
| 7,342,279 B2 | 3/2008 | Harari et al. | |
| 7,443,757 B2 * | 10/2008 | Cernea et al. | 365/226 |
| 2002/0051384 A1 | 5/2002 | Cernea et al. | |
| 2006/0158935 A1 | 7/2006 | Chan et al. | |
| 2006/0184720 A1 | 8/2006 | Sinclair et al. | |
| 2009/0080265 A1 | 3/2009 | Mokhlesi et al. | |

OTHER PUBLICATIONS

Notification of Transmittal of the International Search Repoirt and the Written Opinion of the International Searching Authority, or the Declaration for Int'l Application No. PCT /U S20 14/040925 mailed on Nov. 7, 2014, 9 pages.

* cited by examiner

*Primary Examiner* — Thao H Bui
(74) *Attorney, Agent, or Firm* — Davis Wright Tremaine LLP (57) ABSTRACT

The selected bit line in a non-volatile memory carries a cell conduction current to be measured and also a leakage current or noise due to weak coupling with neighboring array structures. In a first phase, a sense amplifier senses the bit line current by discharging a capacitor with the combined current (cell conduction current plus the leakage current) over a predetermined time. In a second phase, the cell conduction current is minimized and significantly the leakage current in the selected bit line is used to recharge in tandem the capacitor in a time same as the predetermined time, effectively subtracting the component of the leakage current measured in the first sensing phase. The resultant voltage drop on the capacitor over the two sensing phases provides a measure of the cell conduction current alone, thereby avoiding reading errors due to the leakage current present in the selected bit line.

18 Claims, 6 Drawing Sheets

Timing Diagrams

Differential Current Sensing

FIG. 5

Timing Diagrams for Current Sensing with Low-Voltage Operation

FIG. 6

220' — In a first sensing phase, discharging the capacitor with the first bit line current for a predetermined period of time wherein the first predetermined voltage decreases to a second voltage; and wherein the capacitor is provided with first and second terminals, the second terminal being operated at a higher voltage level than the first terminal and with a predetermined boosting voltage applied temporarily to the first terminal during the first sensing phase

Differential Current Sensing with Low-Voltage Operation

FIG. 7

DIFFERENTIAL CURRENT SENSE AMPLIFIER AND METHOD FOR NON-VOLATILE MEMORY

BACKGROUND

The subject matter of this application is sensing circuits and methods for sensing conduction currents that correspond to memory states of non-volatile memory cells.

Uses of re-programmable non-volatile mass data storage systems utilizing flash memory are widespread for storing data of computer files, camera pictures, and data generated by and/or used by other types of hosts. A popular form of flash memory is a card that is removably connected to the host through a connector. There are many different flash memory cards that are commercially available, examples being those sold under trademarks CompactFlash (CF), the MultiMediaCard (MMC), Secure Digital (SD), miniSD, microSD, Memory Stick, Memory Stick Micro, xD-Picture Card, SmartMedia and TransFlash. These cards have unique mechanical plugs and/or electrical interfaces according to their specifications, and plug into mating receptacles provided as part of or connected with the host.

Another form of flash memory systems in widespread use is the flash drive, which is a hand held memory system in a small elongated package that has a Universal Serial Bus (USB) plug for connecting with a host by plugging it into the host's USB receptacle. SanDisk Corporation, assignee hereof, sells flash drives under its Cruzer, Ultra and Extreme Contour trademarks. In yet another form of flash memory systems, a large amount of memory is permanently installed within host systems, such as within a notebook computer in place of the usual disk drive mass data storage system. Each of these three forms of mass data storage systems generally includes the same type of flash memory arrays. They each also usually contain its own memory controller and drivers but there are also some memory only systems that are instead controlled at least in part by software executed by the host to which the memory is connected. The flash memory is typically formed on one or more integrated circuit chips and the controller on another circuit chip. But in some memory systems that include the controller, especially those embedded within a host, the memory, controller and drivers are often formed on a single integrated circuit chip.

There are two primary techniques by which data are communicated between the host and flash memory systems. In one of them, addresses of data files generated or received by the system are mapped into distinct ranges of a continuous logical address space established for the system. The extent of the address space is typically sufficient to cover the full range of addresses that the system is capable of handling. As one example, magnetic disk storage drives communicate with computers or other host systems through such a logical address space. The host system keeps track of the logical addresses assigned to its files by a file allocation table (FAT) and the memory system maintains a map of those logical addresses into physical memory addresses where the data are stored. Most memory cards and flash drives that are commercially available utilize this type of interface since it emulates that of magnetic disk drives with which hosts have commonly interfaced.

In the second of the two techniques, data files generated by an electronic system are uniquely identified and their data logically addressed by offsets within the file. Theses file identifiers are then directly mapped within the memory system into physical memory locations. Both types of host/memory system interfaces are described and contrasted elsewhere, such as in patent application publication no. US 2006/0184720 A1.

Flash memory systems typically utilize integrated circuits with arrays of memory cells that individually store an electrical charge that controls the threshold level of the memory cells according to the data being stored in them. Electrically conductive floating gates are most commonly provided as part of the memory cells to store the charge but dielectric charge trapping material is alternatively used. A NAND architecture is generally preferred for the memory cell arrays used for large capacity mass storage systems. Other architectures, such as NOR, are typically used instead for small capacity memories. Examples of NAND flash arrays and their operation as part of flash memory systems may be had by reference to U.S. Pat. Nos. 5,570,315, 5,774,397, 6,046,935, 6,373,746, 6,456,528, 6,522,580, 6,643,188, 6,771,536, 6,781,877 and 7,342,279.

The amount of integrated circuit area necessary for each bit of data stored in the memory cell array has been reduced significantly over the years, and the goal remains to reduce this further. The cost and size of the flash memory systems are therefore being reduced as a result. The use of the NAND array architecture contributes to this but other approaches have also been employed to reducing the size of memory cell arrays. One of these other approaches is to form, on a semiconductor substrate, multiple two-dimensional memory cell arrays, one on top of another in different planes, instead of the more typical single array. Examples of integrated circuits having multiple stacked NAND flash memory cell array planes are given in U.S. Pat. Nos. 7,023,739 and 7,177,191.

Another type of re-programmable non-volatile memory cell uses variable resistance memory elements that may be set to either conductive or non-conductive states (or, alternately, low or high resistance states, respectively), and some additionally to partially conductive states and remain in that state until subsequently re-set to the initial condition. The variable resistance elements are individually connected between two orthogonally extending conductors (typically bit lines and word lines) where they cross each other in a two-dimensional array. The state of such an element is typically changed by proper voltages being placed on the intersecting conductors. Since these voltages are necessarily also applied to a large number of other unselected resistive elements because they are connected along the same conductors as the states of selected elements being programmed or read, leakage currents can flow through them. When the memory state of a memory cell is read by measuring its conduction current, the reading may be erroneous due to the existence of noise such as an additional leakage current.

The desire to perform data reading and programming operations with a large number of memory cells in parallel results in reading voltages being applied to a very large number of other memory cells and the issue of managing leakage currents to minimize the problems of errors and loss of margin during read operations.

SUMMARY OF THE INVENTION

Differential Current Sensing

A memory cell in a memory array is accessible by a pair of selected word line and bit line. When appropriate bias voltages are applied to the pair of selected word line and bit line, the memory cell will have a cell conduction current depending on its memory state.

The selected bit line carrying the cell conduction current may also have a leakage current or noise component due to weak coupling with neighboring array structures. A sense amplifier sensing from the selected bit line over two sensing phases is able to differentiate the cell conduction current from the leakage current. In a first phase, the sense amplifier senses the bit line current by discharging a capacitor with the combined current (cell conduction current plus the leakage current) over a predetermined time. In a second phase, the cell conduction current is minimized and significantly the leakage current in the selected bit line is used to recharge in tandem the capacitor in a time same as the predetermined time, effectively subtracting the leakage current component included in the first sensing phase. The resultant voltage drop on the capacitor over the two sensing phases provides a measure of the cell conduction current alone, thereby avoiding reading errors due to the leakage current present in the selected bit line.

According to one aspect of the invention, a method of sensing a conduction current of a memory cell includes providing a bit line for accessing the memory cell, the bit line having a first bit line current constituted from the conduction current of the memory cell and a current due to noise; precharging a capacitor to a first predetermined voltage above a reference voltage; and in a first sensing phase, discharging the capacitor with the first bit line current for a predetermined period of time wherein the first predetermined voltage decreases to a second voltage; and in a second sensing phase, minimizing the conduction current of the memory cell so that the bit line has a second bit line current significantly constituted from the current due to noise, and charging the capacitor with the second bit line current for a same time as the predetermined period of time, wherein the second voltage increases to a third voltage; and comparing the third voltage with the reference voltage to give a measure of the conduction current of the memory cell.

According to another embodiment of the invention, the method further includes temporarily boosting the voltages at the capacitor by a predetermined boosting voltage during the first sensing phase to provide more headroom.

According to another aspect of the invention, a sense amplifier for sensing a conduction current of a memory cell of a non-volatile memory includes a bit line for accessing the memory cell, the bit line having a first bit line current constituted from the conduction current of the memory cell and a current due to noise; a bit line voltage circuit for maintain the bit line at a predetermined voltage; a capacitor; a precharging circuit coupled to said capacitor to precharge the capacitor to a first predetermined voltage above a reference voltage; and in a first sensing phase, a first set of signals to enable said capacitor to be coupled for discharging by the first bit line current for a predetermined period of time wherein the first predetermined voltage decreases to a second voltage; and in a second sensing phase, where the memory cell has the conduction current minimized so that the bit line has a second bit line current significantly constituted from the current due to noise, and a second set of signals to enable said capacitor to be coupled for charging by the second bit line current for a same time as the predetermined period of time, wherein the second voltage increases to a third voltage; and a comparator for comparing the third voltage with the reference voltage to give a measure of the conduction current of the memory cell.

Various aspects, advantages, features and details of the innovative three-dimensional variable resistive element memory system are included in a description of exemplary examples thereof that follows, which description should be taken in conjunction with the accompanying drawings.

All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DESCRIPTION OF EXEMPLARY EMBODIMENTS

Figure 1:
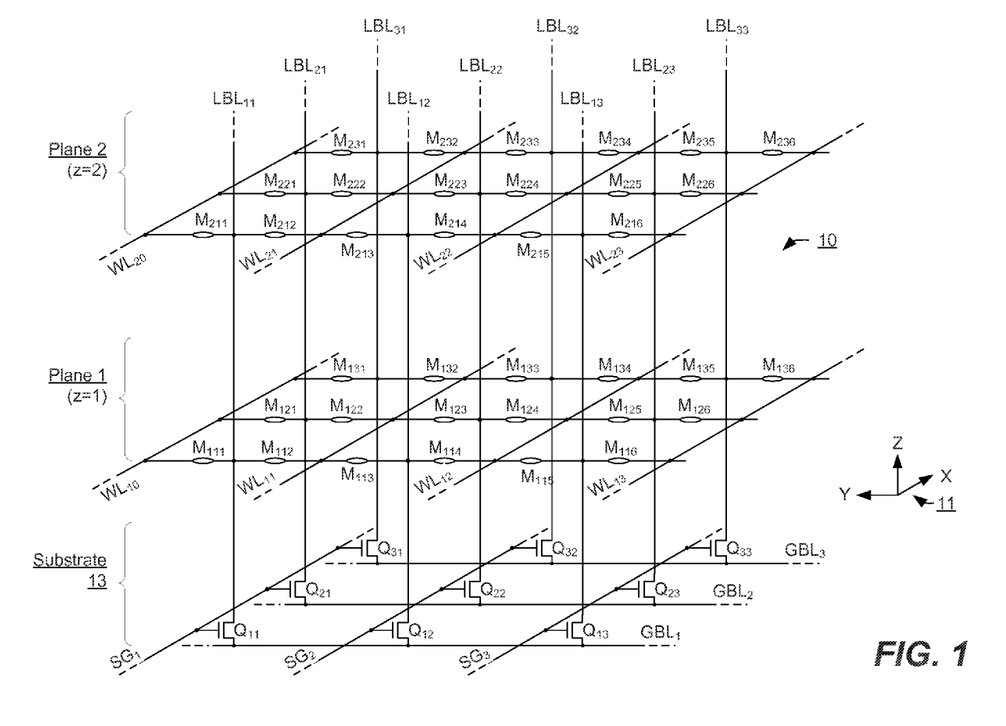
FIG. 1 illustrates schematically an architecture of a three-dimensional memory in the form of an equivalent circuit of a portion of such a memory.

FIG. 1 illustrates schematically an example of a memory 10 having a three-dimensional array of memory elements or cells. An equivalent circuit of a portion of such a memory is shown. A standard three-dimensional rectangular coordinate system 11 is used for reference, the directions of each of vectors x, y and z being orthogonal with the other two.

A circuit for selectively connecting internal memory elements with external data circuits is preferably formed in a semiconductor substrate 13. In this specific example, a two-dimensional array of select or switching devices $Q_{xy}$ are utilized, where x gives a relative position of the device in the x-direction and y its relative position in the y-direction. The individual devices $Q_{xy}$ may be a select gate or select transistor, as examples. Global bit lines ($GBL_x$) are elongated in the y-direction and have relative positions in the x-direction that are indicated by the subscript. The global bit lines ($GBL_x$) are individually connectable with the source or drain of the select devices Q having the same position in the x-direction, although during reading and also typically programming only one select device connected with a specific global bit line is turned on at time. The other of the source or drain of the individual select devices Q is connected with one of the local bit lines ($LBL_{xy}$). The local bit lines are elongated vertically, in the z-direction, and form a regular two-dimensional array in the x (row) and y (column) directions.

In order to connect one set (in this example, designated as one row) of local bit lines with corresponding global bit lines, control gate lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the control gate lines $SG_y$ receives a voltage that turns on the select devices to which it is connected. The remaining control gate lines receive voltages that keep their connected select devices off.

It may be noted that since only one select device ($Q_{xy}$) is used with each of the local bit lines ($LBL_{xy}$), the pitch of the array across the semiconductor substrate in both x and y-directions may be made very small, and thus the density of the memory storage elements large.

Memory storage elements $M_{zxy}$ are formed in a plurality of planes positioned at different distances in the z-direction above the substrate 13. Two planes 1 and 2 are illustrated in FIG. 1 but there will typically be more, such as 4, 6 or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines. The individual memory storage elements $M_{zxy}$ are connected between one local bit line $LBL_{xy}$ and one word line $WL_{zy}$ adjacent these individual crossings. An individual memory element $M_{zxy}$ is therefore addressable by placing proper voltages on the local bit line $LBL_{xy}$ and word line $WL_{zy}$ between which the memory element is connected. The voltages are chosen to provide the electrical stimulus necessary to cause the state of the memory element to change from an existing state to the desired new state. The levels, duration and other characteristics of these voltages depend upon the material that is used for the memory elements.

Each "plane" of the three-dimensional memory cell structure is typically formed of at least two layers, one in which the conductive word lines $WL_{zy}$ are positioned and another of a dielectric material that electrically isolates the planes from each other. Additional layers may also be present in each plane, depending for example on the structure of the memory elements $M_{zxy}$. The planes are stacked on top of each other on a semiconductor substrate with the local bit lines $LBL_{xy}$ being connected with storage elements $M_{zxy}$ of each plane through which the local bit lines extend.

Figure 2:
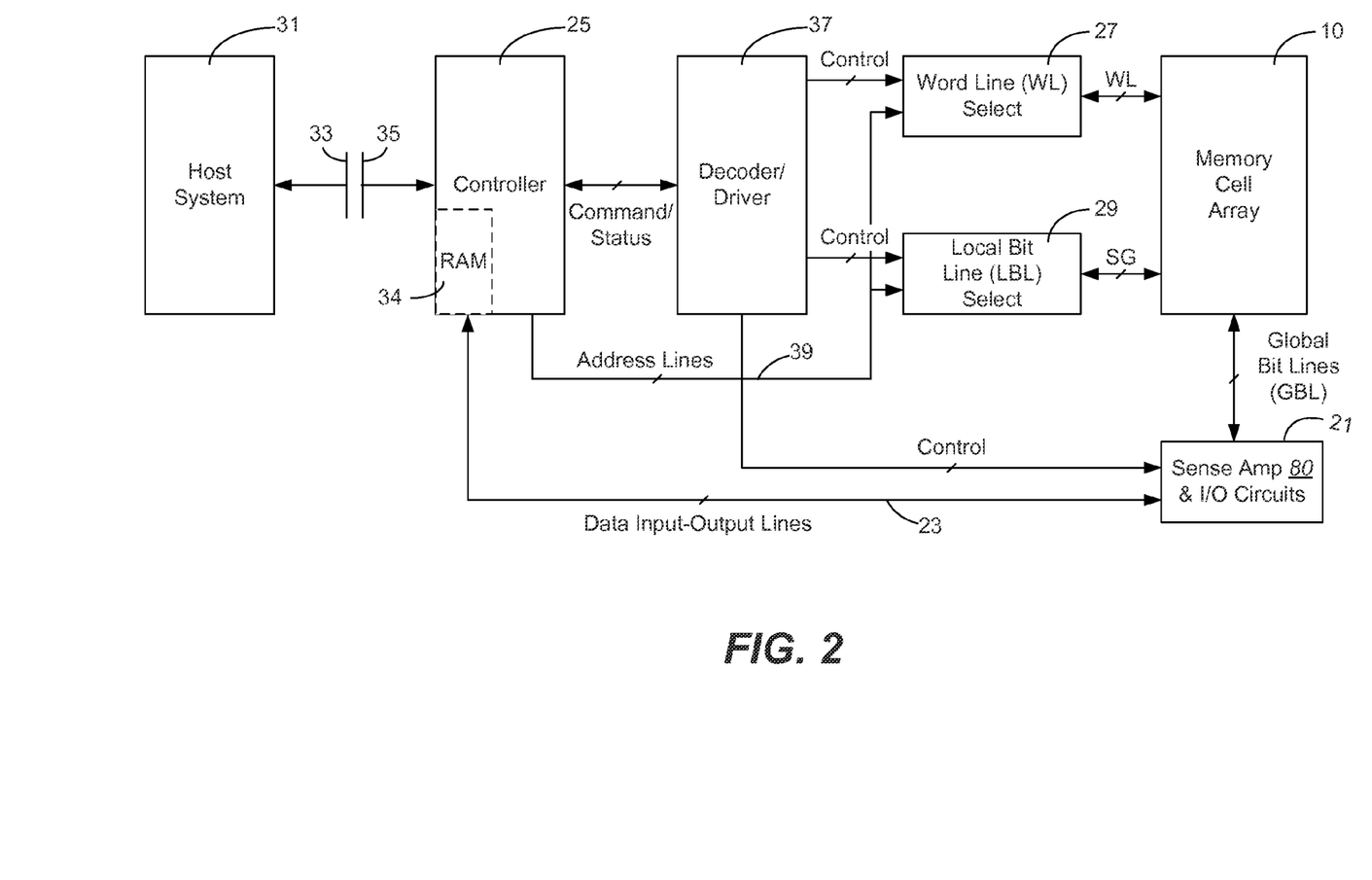
FIG. 2 is a block diagram of an illustrative memory system that can use the three-dimensional memory of FIG. 1.

FIG. 2 is a block diagram of an illustrative memory system that can use the three-dimensional memory 10 of FIG. 1. Sense amplifier and I/O circuits 21 are connected to provide (during programming) and receive (during reading) analog electrical quantities in parallel over the global bit-lines $GBL_x$ of FIG. 1 that are representative of data stored in addressed storage elements $M_{zxy}$. The circuits 21 typically contain sense amplifiers for converting these electrical quantities into digital data values during reading, which digital values are then conveyed over lines 23 to a memory system controller 25. Conversely, data to be programmed into the array 10 are sent by the controller 25 to the sense amplifier and I/O circuits 21, which then programs that data into addressed memory element by placing proper voltages on the global bit lines $GBL_x$. For binary operation, one voltage level is typically placed on a global bit line to represent a binary "1" and another voltage level to represent a binary "0". The memory elements are addressed for reading or programming by voltages placed on the word lines $WL_{zy}$ and select gate control lines $SG_y$ by respective word line select circuits 27 and local bit line circuits 29. In the specific three-dimensional array of FIG. 1, the memory elements lying between a selected word line and any of the local bit lines $LBL_{xy}$ connected at one instance through the select devices $Q_{xy}$ to the global bit lines $GBL_x$ may be addressed for programming or reading by appropriate voltages being applied through the select circuits 27 and 29.

The memory system controller 25 typically receives data from and sends data to a host system 31. The controller 25 usually contains an amount of random-access-memory (RAM) 34 for temporarily storing such data and operating information. Commands, status signals and addresses of data being read or programmed are also exchanged between the controller 25 and host 31. The memory system operates with a wide variety of host systems. They include personal computers (PCs), laptop and other portable computers, cellular telephones, personal digital assistants (PDAs), digital still cameras, digital movie cameras and portable audio players. The host typically includes a built-in receptacle 33 for one or more types of memory cards or flash drives that accepts a mating memory system plug 35 of the memory system but some hosts require the use of adapters into which a memory card is plugged, and others require the use of cables therebetween. Alternatively, the memory system may be built into the host system as an integral part thereof.

The memory system controller 25 conveys to decoder/driver circuits 37 commands received from the host. Similarly, status signals generated by the memory system are communicated to the controller 25 from the circuits 37. The circuits 37 can be simple logic circuits in the case where the controller controls nearly all of the memory operations, or can include a state machine to control at least some of the repetitive memory operations necessary to carry out given commands. Control signals resulting from decoding commands are applied from the circuits 37 to the word line select circuits 27, local bit line select circuits 29 and sense amplifier and I/O circuits 21. Also connected to the circuits 27 and 29 are address lines 39 from the controller that carry physical addresses of memory elements to be accessed within the array 10 in order to carry out a command from the host. The physical addresses correspond to logical addresses received from the host system 31, the conversion being made by the controller 25 and/or the decoder/driver 37. As a result, the circuits 29 partially address the designated storage elements within the array 10 by placing proper voltages on the control elements of the select devices $Q_{xy}$ to connect selected local bit lines ($LBL_{xy}$) with the global bit lines ($GBL_x$). The addressing is completed by the circuits 27 applying proper voltages to the word lines $WL_{zy}$ of the array.

Although the memory system of FIG. 2 utilizes the three-dimensional memory element array 10 of FIG. 1, the system is not limited to use of only that array architecture. A given memory system may alternatively combine this type of memory with other another type including flash memory, such as flash having a NAND memory cell array architecture, a magnetic disk drive or some other type of memory. The other type of memory may have its own controller or may in some cases share the controller 25 with the three-dimensional memory cell array 10, particularly if there is some compatibility between the two types of memory at an operational level.

A memory cell in the memory array 10 is accessible by a pair of selected word line and bit line. When appropriate bias voltages are applied to the pair of selected word line and bit line, the memory cell will have a cell conduction current depending on its memory state.

Although each of the memory elements $M_{zxy}$ in the array of FIG. 1 may be individually addressed for changing its state according to incoming data or for reading its existing storage state, it is certainly preferable to program and read the array in units of multiple memory elements in parallel. In the three-dimensional array of FIG. 1, one row of memory elements on one plane may be programmed and read in parallel. The number of memory elements operated in parallel depends on the number of memory elements connected to the selected word line. For example, in a read operation, all word lines and bit lines in the array are set to 0.5V except the selected word line (e.g., $WL_{10}$) which is set to 0V. This will set up a voltage difference of 0.5 across a page of memory cells (e.g., $M_{211}$, $M_{221}$, $M_{231}$, . . . ) suitable for reading their conduction currents via their respective local and global bit lines.

However, in practice parasitic currents occur due to coupling of neighboring structures. Thus the bit lines also carry these parasitic currents as leakage currents, which are noise to the cell current being measured. Parasitic currents during such a read operation have two undesirable effects. As with programming, parasitic currents place increased demands on the memory system power supply. In addition, it is possible for parasitic currents to exist that are erroneously included in the currents though the addressed memory elements that are being read. This can therefore lead to erroneous read results if such parasitic currents are large enough.

U.S. Pat. No. 7,064,568 describes a sense amplifier suitable for sensing conduction current of a memory cell in a NAND memory without the ability to differentiate from any leakage current in a selected bit line.

U.S. application Ser. No. 13/794,344, filed on Mar. 11, 2013, "Non-Volatile Memory Having 3D Array Architecture with Bit Line Voltage Control and Methods Thereof" discusses the problem of leakage currents during read operations.

The level of parasitic currents increases with the number of planes and with the number of memory elements connected along the individual word lines within each plane. But since the number of word lines on each plane does not significantly affect the amount of parasitic current, the planes may individually include a large number of word lines.

Sense Amplifier for Sensing Differential Currents in a Memory

In many memory arrays, the memory cells in the array are accessed by a lattice of array elements such as interconnected word lines, bit lines and memory cells. The biasing conditions on the selected word line and bit lines and the unselected word lines and bit lines are such that a leakage current $I_{NOISE}$ may appear in the selected bit line 31 in which $I_{MEM}$ is to be detected.

Figure 3:
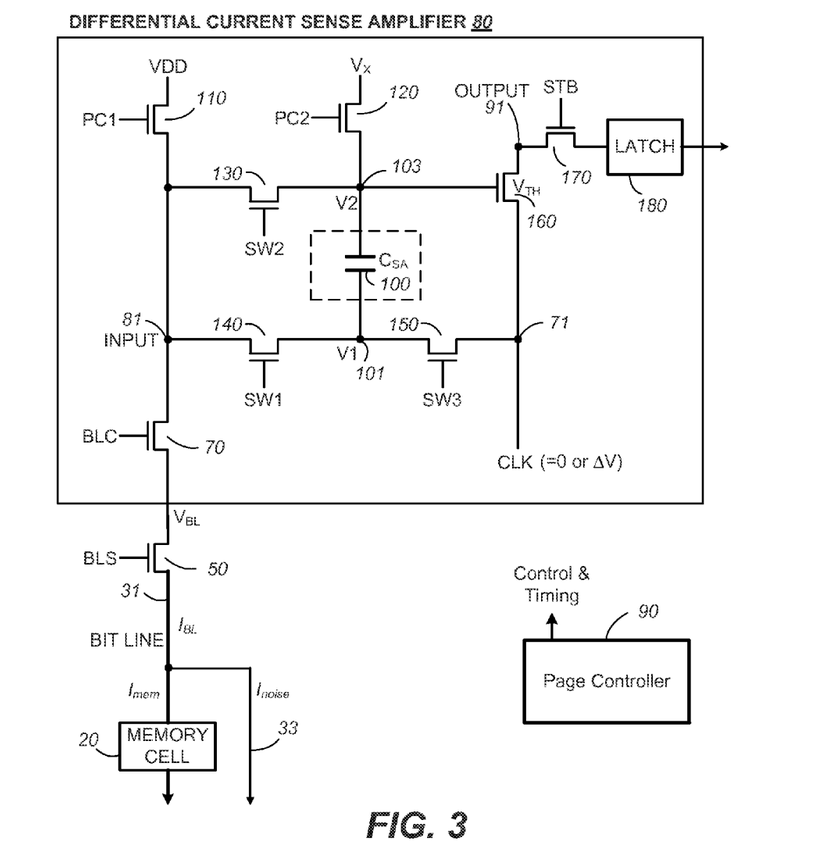
FIG. 3 illustrates a sense amplifier for sensing differential current of a memory cell.

FIG. 3 illustrates a sense amplifier for sensing differential current in the selected bit line 31. A sense amplifier 80 is able to sense and differentiate the conduction current $I_{MEM}$ in the selected bit line 31 from any leakage current $I_{NOISE}$ contributed from a current branch 33. When a memory cell 20 is turned on, its memory state can be read by sensing the magnitude of its conduction current $I_{MEM}$. Typically, the memory cell being sensed is among a page of such memory cells in a memory array being sensed in parallel. Each memory cell 20 of the page is accessed by a corresponding bit line 31, which is selected by decoding the bit line select signal BLS to connect the selected bit line 31 via a bit line select switch 50 to a corresponding sense amplifier 80.

The sense amplifier 80 essentially measures the bit line current by the rate it discharges a capacitor $C_{SA}$ 100. The faster the discharge, the larger is the current. In a first phase, the sense amplifier 80 senses the bit line current by discharging the capacitor $C_{SA}$ 100 with the combined current ($I_{MEM}$+ $I_{NOISE}$) over a predetermined time. In a second phase, the cell conduction current is minimized so that the leakage current $I_{NOISE}$ is the significant current in the selected bit line to recharge in tandem the capacitor in a time same as the predetermined time, effectively subtracting the component of the leakage current measured in the first sensing phase. This is accomplished by reversing the connection of the bit line to the terminals of the capacitor relative to the first sensing phase. The resultant voltage drop on the capacitor over the two sensing phases provides a measure of the cell conduction current alone, thereby avoiding reading errors due to the leakage current present in the selected bit line.

The capacitor $C_{SA}$ 100 has a first terminal 101 and a second terminal 103. The first terminal 101 has a voltage V1 and the second terminal 103 has a voltage V2 higher than V1.

The sense amplifier 80 has the bit line current throw through an INPUT node 81 from the bit line 31 via a bit line voltage clamp 70. The INPUT node 81 is able to couple to the second terminal 103 via a transistor switch 130 that is controlled by a signal SW2. The INPUT node 81 is also able to couple to the first terminal 101 via a transistor switch 140 that is controlled by a signal SW1.

Also the INPUT node 81 is able to be precharged by a precharge driver 110. The precharge driver 110 has its drain at VDD and its source connected to the INPUT node 81 and its gate controlled by a signal PC1.

The bit line voltage is maintained by the sense amplifier 80 with the precharge driver 110 and the bit line voltage clamp transistor 70 in series with the bit line 31. To maintain the bit line at $V_{BL}$, the transistor 70 operates like a diode clamp with its source coupled to the bit line 31 and its drain connected to the INPUT node 101 of the sense amplifier 80. It has a gate voltage set to $V_{BL}+V_T$, where $V_T$ is the threshold voltage. In this way, the bit line voltage clamp 70 isolates the bit line 31 from the INPUT node 81 and sets a constant voltage level for the bit line such as for example $V_{BL}$=0.5 to 0.7 volts. For the bit line voltage clamp transistor 70 to function, its drain voltage at the INPUT node 101 has to be greater than its source voltage, i.e., greater than $V_{BL}$.

The first terminal 101 of the capacitor $C_{SA}$ 100 is at a voltage V1 and can be coupled to a clock signal CLK at a node 71 when a connecting transistor switch 150 as controlled by a signal SW3, is turned on. In one embodiment, the clock signal CLK is always at 0V. In another embodiment as will be described later, the clock signal CLK has two states, which is either at 0V or during the first sensing phase boosted by a predetermined ΔV.

The first terminal 101, as described earlier, can also be selectively coupled to the INPUT node 81 via the transistor switch 140 during the second sensing phase.

The second terminal 103 of the capacitor $C_{SA}$ 100 is at a voltage V2. It can be precharged by a precharger driver 120 with its drain at $V_X$ (which can be another supply voltage higher than VDD) and controlled by a signal PC2. It is selectively coupled to the INPUT node 81 via the transistor switch 130 during the first sensing phase.

The second terminal 103 is also connected to a gate of a discriminating transistor 160. The discriminating transistor 160 has its source and drain across the node 71 and an OUTPUT node 91. The voltage level at the OUTPUT node 91 can be saved in a latch 180 when a transistor switch 170 is turned on by a signal STB.

In general, there will be a page of memory cells being operated on in parallel by a corresponding number of sense amplifiers 80 The page of memory cells is selected by a selected word line and a page of selected bit lines. A page controller 90 supplies control and timing signals to each of the sense amplifiers. In one embodiment, the page controller 90 is implemented as part of a state machine in a control circuitry on a memory chip.

Figure 4:
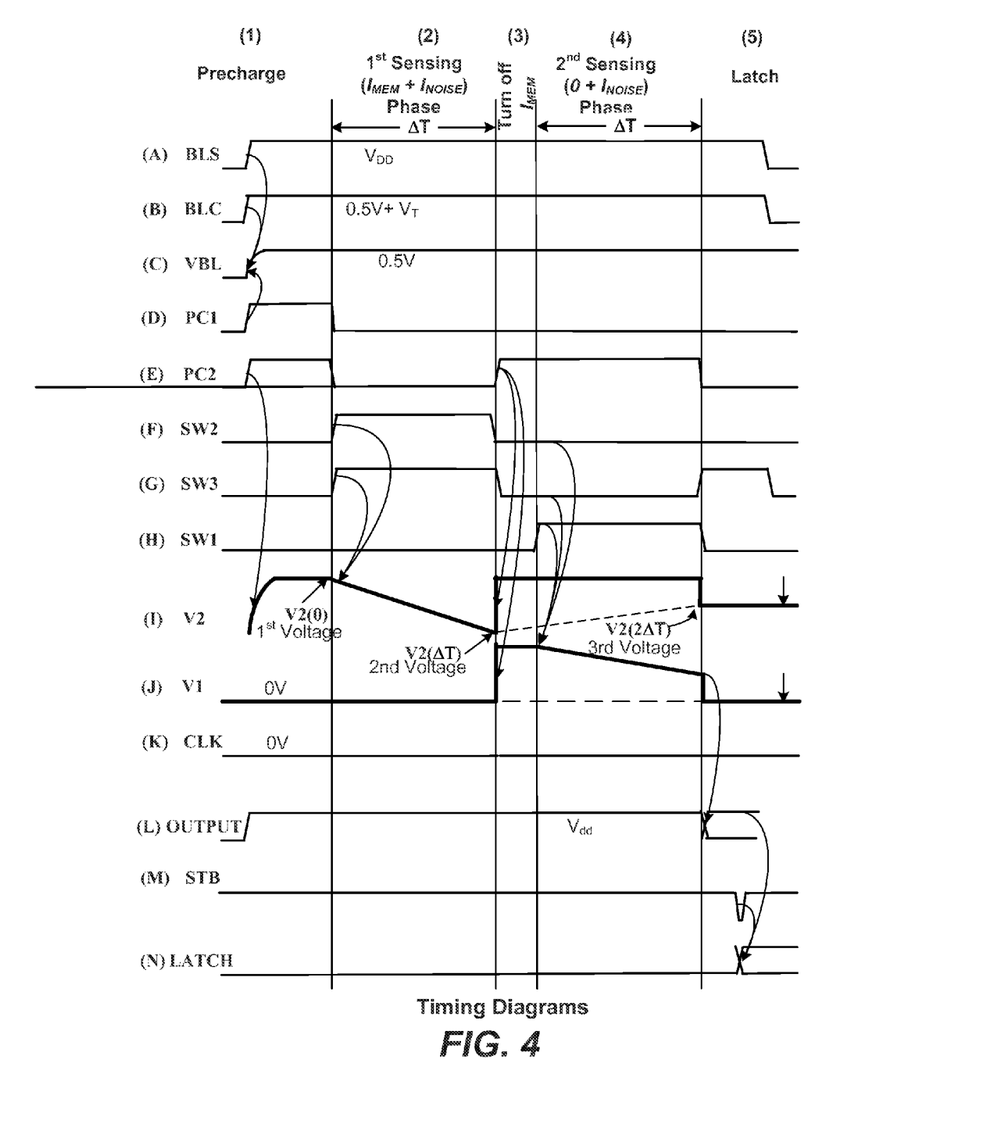
FIGS. 4(A)-4(N) are timing diagrams illustrating schematically the operations of the sense amplifier shown in FIG. 3.

FIGS. 4(A)-4(N) are timing diagrams illustrating schematically the operations of the sense amplifier 80 shown in FIG. 3.

Precharge Phase

The bit line 31 is selected by the signal BLS going to VDD to turn on the select transistor 50 (FIG. 4(A)(1)).

Both the bit line 31 and the second terminal 103 of the capacitor $C_{SA}$ 100 are to be precharged. The bit line 31 is precharged to $V_{BL}$ by the precharge driver 110 with PC1

HIGH. The second terminal 103 is initially precharged to a voltage V2(0) by the precharge driver 120 with PC2 HIGH. When precharge is completed, the signals PC1 and PC2 go LOW to turn off the precharge driver 110 and the precharge driver 120 respectively (FIGS. 4(B)(1)-4(E)(1)).

First Sensing Phase for Sensing the Combined Current ($I_{BL}=I_{MEM}+I_{NOISE}$)

The current to discharge the capacitor $C_{SA}$ 100 is provided by the current in the bit line 31, which is $I_{BL}=I_{MEM}+I_{NOISE}$. The memory cell has the conduction current $I_{MEM}$ when it is turned on with the bit line voltage biased to $V_{BL}$.

The sense amplifier 80 determines the magnitude of the bit line current $I_{BL}$ by measuring the rate it discharges a capacitor $C_{SA}$ 100. The bit line 31 via the INPUT node 81 is coupled to the second terminal 103 when the signal SW2 goes HIGH. Also with SW3 HIGH, the first terminal 101 is coupled to the node 71 to CLK which is at 0V. This will enable the bit line current $I_{BE}$ to discharge the capacitor $C_{SA}$ 100. The rate of discharge is effectively determined by noting the drop, after a predetermined discharge period $\Delta T$, of the voltage V2 from V2(0) to V2($\Delta T$). See FIG. 4(F)(2)-4(K)(2).

Second Sensing Phase for Sensing and Subtracting the Noise Current ($I_{BL}=I_{NOISE}$)

In this phase, the INPUT node 81 is switch from the second terminal 103 to the first terminal 101. This is accomplished by turning off the transistor switch 130 and turning on the transistor switch 140 disposed between the INPUT node 81 and the first terminal 101. The second terminal 103 is then powered by turning on the precharge driver 120 with PC2 going HIGH. This will set V2=V1=V2(0). The transistor switch 140 is controlled by the signal SW1. This allows the first terminal 101 to be exclusively connected to the INPUT node 81 when the transistor switch 150 between the first terminal 101 and the node 71 to CLK is turned off by the signal SW3.

With this setup, the memory cell 20 is minimized with $I_{MEM}\sim 0$ and $I_{BE}\sim I_{NOISE}$. This is accomplished by biasing the selected word line (not shown in FIG. 3) to the same voltage as the selected bit line 31. Now, with the INPUT node 81 connected to the capacitor $C_{SA}$ 100 in reverse, the leakage current $I_{NONE}$ is effectively used to charge the capacitor $C_{SA}$ 100 instead. (It is really pulling V1 down to increase the voltage difference across the capacitor.) The charging is allowed for a time same as the predetermined period $\Delta T$ in the first sensing phase so that it cancels the discharging effect of the $I_{NOISE}$ component in the first sensing phase. At the end of the predetermined period, V1 is reset to 0V by connecting back to CLK at node 71. This will also shift V2 down to effectively have the previous V2($\Delta T$) at the second terminal 103 is increased to V2(2$\Delta T$). This final voltage corresponds to the discharging effect of only $I_{MEM}$ on the capacitor $C_{SA}$ 100 and is a measure of $I_{MEM}$ without the interference of $I_{NOISE}$. See FIGS. 4(F)(3)(4)-4(K)(3)(4).

The result V2(2$\Delta T$) can now be measured by the discriminating transistor 160. The magnitude of V2(2$\Delta T$) is measured by observing whether it has dropped sufficiently to turn off a discriminating transistor 160 or not (i.e. whether V2($\Delta T$) is smaller or remains greater than $V_{TH}$, the threshold of the discriminating transistor 160.) This will cause the OUTPUT node 91 at a drain of the discriminating transistor 160 to remain at logic HIGH or be pulled to CLK (=0V, logic LOW) respectively.

The state of the OUTPUT node 91 is the sensed result and is stored in a latch 180 when an interconnecting transistor 170 is enabled by a signal STB. See FIGS. 4(L)(5)-4(N)(5).

In the present embodiment the page of memory cells is biased to give a page of memory cells with minimized cell conduction currents so that $I_{MEM}\sim 0$ and $I_{BL}\sim I_{NOISE}$. In another embodiment, the page of memory cells can be biased to give a page of memory cells with a finite $I_{MEM}$. For example, in the first sensing phase, $I_{BL}=I_{MEM}+I_{NOISE}$, and in the second sensing phase, $I_{BL}=0.3I_{MEM}+I_{NOISE}$. After the difference is subtracted, it will yield an adjusted 0.7 $I_{MEM}$ without any $I_{NOISE}$ component.

Figure 5:
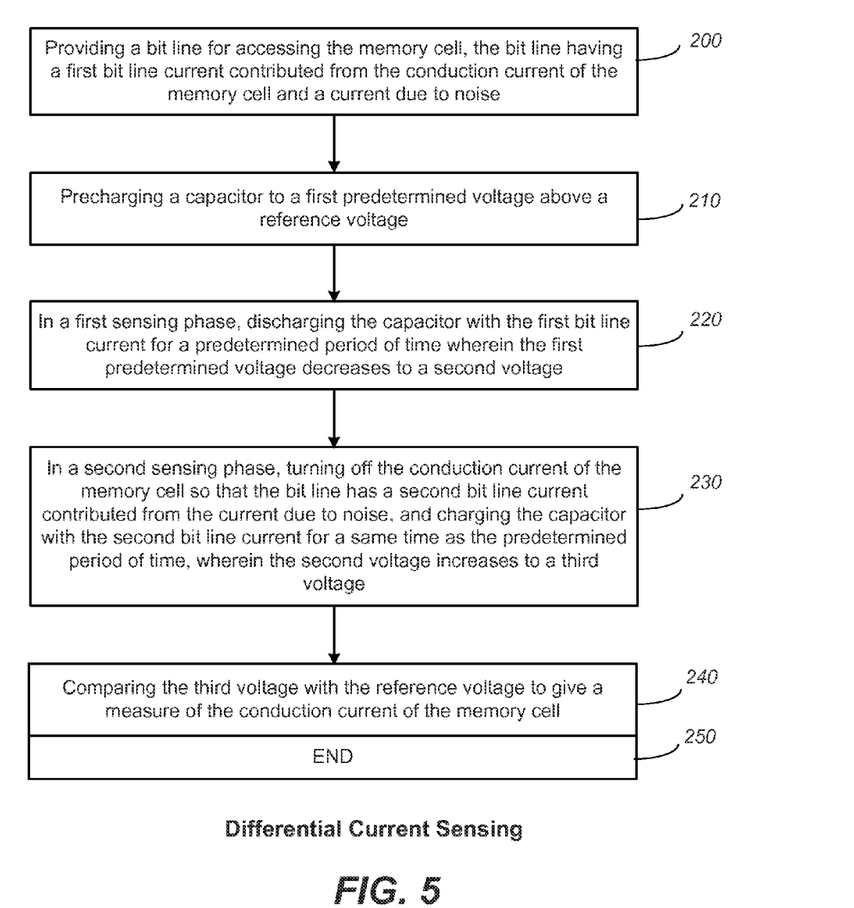
FIG. 5 is a flow diagram illustrating a method of sensing the conduction current of the memory cell.

FIG. 5 is a flow diagram illustrating a method of sensing the conduction current of the memory cell.

STEP 200: Providing a bit line for accessing the memory cell, the bit line having a first bit line current constituted from the conduction current of the memory cell and a current due to noise.

STEP 210: Precharging a capacitor to a first predetermined voltage above a reference voltage.

STEP 220: In a first sensing phase, discharging the capacitor with the first bit line current for a predetermined period of time wherein the first predetermined voltage decreases to a second voltage.

STEP 230: In a second sensing phase, minimizing the conduction current of the memory cell so that the bit line has a second bit line current significantly constituted from the current due to noise, and charging the capacitor with the second bit line current for a same time as the predetermined period of time, wherein the second voltage increases to a third voltage.

STEP 240: Comparing the third voltage with the reference voltage to give a measure of the conduction current of the memory cell.

STEP 250: End.

CLK Signal is to Increase Dynamic Range of the Sensing

In the sense amplifier shown in FIG. 3, the desired bit line voltage is maintained at a constant voltage at $V_{BL}$ by the voltage clamp 70. For this voltage clamp to function properly, its drain side must be above $V_{BL}$. This means that the INPUT node 81 will have an operating range from $V_X$ to slightly about $V_{BL}$. During the first sensing phase, the INPUT node 81 is being discharged by the capacitor $C_{SA}$ 100. In a preferred embodiment, to prevent the voltage at the INPUT node 81 from ever dropping close to $V_{BL}$, the voltage at the second terminal of the capacitor $C_{SA}$ 100 is shifted up during the discharge operation.

The sense amplifier 80 shown in FIG. 3 has the clock signal CLK providing a ground voltage reference level for the first terminal of the capacitor $C_{SA}$ 100. FIG. 4(K) shows the CLK signal to be at 0V at all time in the previous embodiment.

Figure 6:
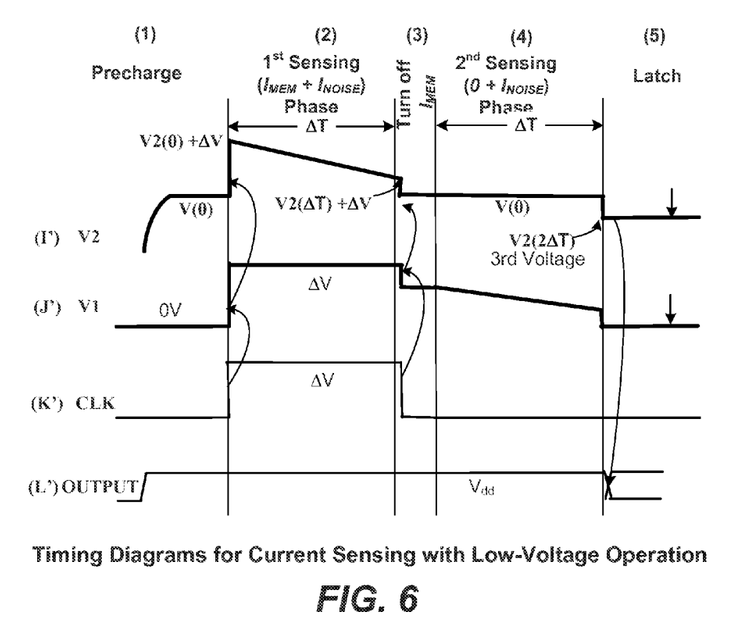
FIG. 6 is a timing diagram illustrating a preferred embodiment for low-voltage operating the sense amplifier 80 shown in FIG. 3.

FIG. 6 is a timing diagram illustrating a preferred embodiment for low-voltage operating the sense amplifier 80 shown in FIG. 3. As illustrated in FIG. 6(K')(2), the clock signal CLK is boosted by a predetermined voltage level $\Delta V$ during the first phase of sensing. This means during the first phase of sensing as the bit line current is discharging the capacitor $C_{SA}$ 100, the voltages on both terminals of the capacitor 100 are boosted by $\Delta V$. Thus the voltage on the second terminal is boosted from V(0) to V(0)+$\Delta V$, allowing the discharge operation to be conducted with increase headroom. At the end of the discharge period, the voltage on the second terminal has dropped to V($\Delta T$)+$\Delta T$ (see FIG. 6(I')(2)). After the discharge has completed, i.e. after the signal SW2 goes LOW to cut off the bit line current to the second terminal of the capacitor $C_{SA}$ 100 (see FIG. 4(F)(2)), the boosting is then terminated with the signal CLK returning to 0V (FIG. 6(K')(3)). As in shown in FIG. 4(E)(3)-4(E)(4), at this point, the precharge driver 120 is enabled by the signal PC2. This will reset V2 to V(0) and V1 shifted by the difference. See FIG. 6(I')(3)-6(K')(3). In the second sensing phase as shown in FIG. 6(J')(4), V1 is being pulled down by the bit line current $I_{BL}$. At the end of the second sensing period, V1 is reset to 0V by connecting back to CLK at node 71. This will also shift V2 down to the final V2(2ΔT). This final voltage corresponds to the discharging effect of only $I_{MEM}$ on the capacitor $C_{SA}$ 100 and is a measure of $I_{MEM}$ without the interference of $I_{NONE}$. See FIGS. 4(F)(3) (4)-4(K)(3)(4).

This will restore the voltage on the second terminal to V2(2ΔT). At this time, even if V2(2ΔT) is below $V_{BL}$, it is isolated from the INPUT node 81 by the disabled transistor 130. In this way, the voltage at the node 81 is operating with an additional headroom of ΔV while being discharged during the first sensing phase.

Figure 7:
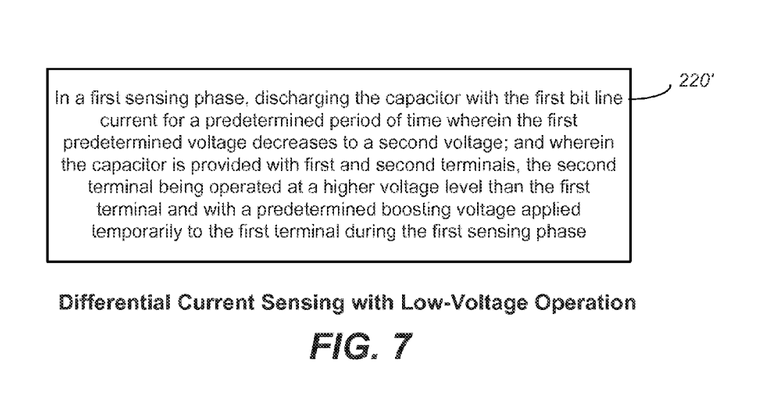
FIG. 7 is a flow diagram illustrating another embodiment of the method of sensing the conduction current of the memory cell under low-voltage condition.

FIG. 7 is a flow diagram illustrating another embodiment of the method of sensing the conduction current of the memory cell under low-voltage condition. The method is similar to that illustrated in FIG. 5, except STEP 220 for the first sensing phase is being replaced by the following STEP 220'.

STEP 220': In a first sensing phase, discharging the capacitor with the first bit line current for a predetermined period of time wherein the first predetermined voltage decreases to a second voltage; and wherein the capacitor is provided with first and second terminals, the second terminal being operated at a higher voltage level than the first terminal and with a predetermined boosting voltage applied temporarily to the first terminal during the first sensing phase.

Conclusion

Although the various aspects of the present invention have been described with respect to exemplary embodiments thereof, it will be understood that the present invention is entitled to protection within the full scope of the appended claims.

It is claimed:

1. A method of sensing a conduction current of a memory cell of a non-volatile memory comprising:
   providing a bit line for accessing the memory cell, the bit line having a first bit line current constituted from the conduction current of the memory cell and a current due to noise;
   precharging a capacitor to a first predetermined voltage above a reference voltage;
   in a first sensing phase, discharging the capacitor with the first bit line current for a predetermined period of time wherein the first predetermined voltage decreases to a second voltage;
   in a second sensing phase, minimizing the conduction current of the memory cell so that the bit line has a second bit line current significantly constituted from the current due to noise, and charging the capacitor with the second bit line current for a same time as the predetermined period of time, wherein the second voltage increases to a third voltage; and
   comparing the third voltage with the reference voltage to give a measure of the conduction current of the memory cell.

2. The method as in claim 1, further comprising:
   maintaining the bit line at a predetermined bit line voltage;
   accessing the memory cell is also by a word line; and
   wherein said turning off the conduction current includes setting the word line to have a same voltage as the predetermined bit line voltage.

3. The method as in claim 1, wherein:
   the capacitor is provided with first and second terminals, the second terminal being operated at a higher voltage level than the first terminal; and
   said discharging the capacitor includes coupling the bit line to the second terminal.

4. The method as in claim 1, wherein:
   the capacitor is provided with first and second terminals, the second terminal being operated at a higher voltage level than the first terminal; and
   said charging the capacitor includes coupling the bit line to the first terminal.

5. The method as in claim 1, wherein:
   the capacitor is provided with first and second terminals, the second terminal being operated at a higher voltage level than the first terminal; and
   said method further comprises:
   temporarily applying a predetermined boosting voltage to the first terminal during the first sensing phase.

6. The method as in claim 1, further comprising:
   providing a transistor having a gate and a given threshold to act as the reference voltage; and
   said comparing the third voltage with the reference voltage is to apply the third voltage to the gate and determine if the transistor is conducting or not.

7. The method as in claim 1, wherein:
   the memory cell is one of a group of memory cells being sensed in parallel.

8. The method as in claim 1, wherein:
   the memory cell has a resistance that reversibly shift in resistance in response to a programming voltage applied thereto.

9. The method as in claim 1, wherein:
   the non-volatile memory is of the NAND type.

10. A sensing circuit for sensing a conduction current of a memory cell of a non-volatile memory comprising:
    a bit line for accessing the memory cell, the bit line having a first bit line current constituted from the conduction current of the memory cell and a current due to noise;
    a bit line voltage circuit for maintain the bit line at a predetermined voltage;
    a capacitor;
    a precharging circuit coupled to said capacitor to precharge the capacitor to a first predetermined voltage above a reference voltage;
    in a first sensing phase, a first set of signals enables said capacitor to be coupled for discharging by the first bit line current for a predetermined period of time wherein the first predetermined voltage decreases to a second voltage;
    in a second sensing phase, where the memory cell has the conduction current minimized so that the bit line has a second bit line current significantly constituted from the current due to noise, and a second set of signals enables said capacitor to be coupled for charging by the second bit line current for a same time as the predetermined period of time, wherein the second voltage increases to a third voltage; and
    a comparator for comparing the third voltage with the reference voltage to give a measure of the conduction current of the memory cell.

11. The sensing circuit as in claim 10, further comprising:
    a word line for accessing the memory cell; and
    wherein the memory cell having the conduction current turned off with the word line having a same voltage as the predetermined bit line voltage.

12. The sensing circuit as in claim 10, wherein:
    the capacitor has first and second terminals, the second terminal being operated at a higher voltage level than the first terminal; and
    said first set of signals enables said capacitor to be coupled to the second terminal for discharging by the first bit line current.

13. The sensing circuit as in claim 10, wherein:
the capacitor has first and second terminals, the second terminal being operated at a higher voltage level than the first terminal; and
said second set of signals enables said capacitor to be coupled to the first terminal for charging by the second bit line current.

14. The sensing circuit as in claim 10, wherein:
the capacitor has first and second terminals, the second terminal being operated at a higher voltage level than the first terminal; and
said sensing circuit further comprises:
a clock generator coupled to the first terminal to apply temporarily a predetermined boosting voltage during said first sensing phase.

15. The sensing circuit as in claim 10, wherein:
said comparator is a transistor having a gate and a given threshold to act as the reference voltage, such that the transistor is conducting when the third voltage is larger than with the reference voltage and not conducting when the third voltage is less than the reference voltage.

16. The sensing circuit as in claim 10, wherein:
the memory cell is one of a group of memory cells being sensed in parallel.

17. The sensing circuit as in claim 10, wherein:
the memory cell has a resistance that reversibly shift in resistance in response to a programming voltage applied thereto.

18. The sensing circuit as in claim 10, wherein:
the non-volatile memory is of the NAND type.

* * * * *